(12) United States Patent
Miller, Jr.

(10) Patent No.: US 7,007,060 B2
(45) Date of Patent: Feb. 28, 2006

(54) RANDOM BIT STREAM GENERATION BY AMPLIFICATION OF THERMAL NOISE IN A CMOS PROCESS

(75) Inventor: Robert H Miller, Jr., Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 589 days.

(21) Appl. No.: 10/140,766

(22) Filed: May 8, 2002

(65) Prior Publication Data

US 2004/0006580 A1   Jan. 8, 2004

(51) Int. Cl.
*G06G 7/00*   (2006.01)
*G06F 1/02*   (2006.01)
(52) U.S. Cl. .......................... 708/801; 708/3; 708/255
(58) Field of Classification Search ................ 708/3, 708/255, 801
See application file for complete search history.

(56) References Cited

U.S. PATENT DOCUMENTS

| | | | | |
|---|---|---|---|---|
| 4,176,399 A | * | 11/1979 | Hoffmann et al. | 708/250 |
| 6,070,178 A | * | 5/2000 | Anderson et al. | 708/3 |
| 6,195,669 B1 | * | 2/2001 | Onodera et al. | 708/3 |
| 6,571,263 B1 | * | 5/2003 | Nagai | 708/3 |
| 6,857,003 B1 | * | 2/2005 | Saito | 708/801 |
| 6,862,605 B1 | * | 3/2005 | Wilber | 708/255 |

* cited by examiner

*Primary Examiner*—Tan V. Mai

(57) ABSTRACT

A method and circuit is presented for generating a random bit stream based on thermal noise of a Complementary Metal Oxide Semiconductor (CMOS) device. A circuit implementing the invention preferably includes at least a pair of identically implemented thermal noise generators whose outputs feed a differential amplifier. The differential amplifier measures and amplifies the difference between the noise signals. A sampling circuit compares the difference with a threshold value that is selected to track with process/voltage/temperature variations of the noise generator circuits to output a binary bit having a bit value determined according to the polarity of the noise difference signal relative to the threshold value. The sampling circuit may be clocked to generate a random bit stream.

14 Claims, 4 Drawing Sheets

RANDOM BIT STREAM GENERATION BY AMPLIFICATION OF THERMAL NOISE IN A CMOS PROCESS

FIELD OF THE INVENTION

The present invention pertains generally to random number generation, and more particularly to a method and circuit for generating a random bit stream by amplification of thermal noise in a CMOS process.

BACKGROUND OF THE INVENTION

Random number generation is an important aspect of many digital and electronic applications. For example, in the field of cryptography, random number generation is key to encryption algorithms. A random bit stream is a sequence of binary signals lacking discernible patterns or repetition over time.

In electrical circuitry, a random bit stream may be generated from a source that naturally exhibits random characteristics. For example, thermal noise on a CMOS device in the frequency range between 100 MHz and 1 GHz is generally known to be efficiently random.

However, generating a purely random bit stream based on a physical random phenomenon can be problematic. As known in the art, the mere act of sampling may interfere with the actual randomness of the random physical phenomenon being measured. For example, in order to ensure true randomness, the measurement circuitry cannot introduce any bias into the probability that the measured value will be translated to a binary 0 or a binary 1. For example, if a sampling circuit measures a voltage level of noise at a given moment in time and compares it to a known threshold generated by the sampling circuitry, process/voltage/temperature variations may cause a drift in the threshold value over time, which may skew the sampling circuitry to translate more sampled values to one bit value or the other. Thus, the process is no longer random since there is no longer an equal chance of sampling a "1" or a "0".

Accordingly, a need exists for a technique for generating a purely random bit stream from a physical process. In particular, it would be convenient to generate the purely random bit stream from a naturally occurring randomness source within the circuitry itself. In addition, a need exists for preventing drift from pure randomness over time and across different manufactured circuits due to process/voltage/temperature variation.

SUMMARY OF THE INVENTION

The present invention is a method and circuit for generating a random bit stream by amplification of thermal noise in a CMOS process. In a preferred embodiment of the invention, the random bit generator is immune to drift from true randomness due to process/voltage/temperature variations.

In a preferred embodiment of the invention, a random bit generator circuit includes a pair of identically implemented thermal noise generators whose outputs feed a differential amplifier. The differential amplifier measures and amplifies the difference between the noise signals. A sampling circuit compares the difference with a threshold value that is selected to track with process/voltage/temperature variations of the noise generator circuits to output a binary bit having a bit value determined according to the polarity of the noise difference signal relative to the threshold value. The sampling circuit may be clocked to generate a random bit stream.

In a preferred embodiment, differential techniques are applied to ensure that all the signals in the circuit track one another with respect to process/voltage/temperature variation. These techniques prevent signal bias from being introduced into the measurement circuitry to thereby ensure a purely random bit stream.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and circuit for generating a random bit stream based on thermal noise in a CMOS process is described in detail hereinafter. Although the invention is described in terms of specific illustrative embodiments, it is to be understood that the embodiments described herein are by way of example only and that the scope of the invention is not intended to be limited thereby.

Figure 1:
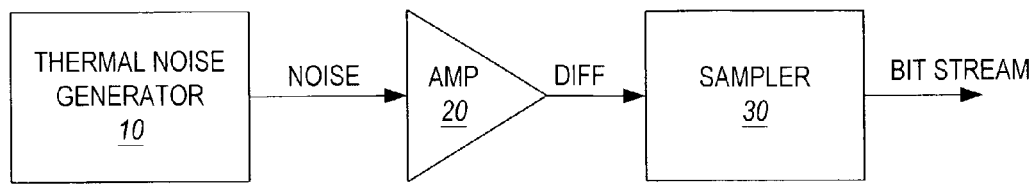
FIG. 1 is a block diagram of a random bit generator in accordance with the principles of the invention.

Turning now to the invention, FIG. 1 is a block diagram of a random bit generator 1 implemented in accordance with the principles of the invention. As illustrated, the random bit generator 1 includes a thermal noise generator 10, an amplifier 20, and a sampler 30. The noise generator 10 preferably generates a noise signal NOISE representative of thermal noise on a CMOS device. Because thermal noise is generally on the order of several millivolts, the noise signal NOISE must be amplified by amplifier 20 in order to accurately sample it. The sampler 30 samples the amplified signal DIFF and generates a bit stream based on the voltage level of the sampled signal.

Figure 2:
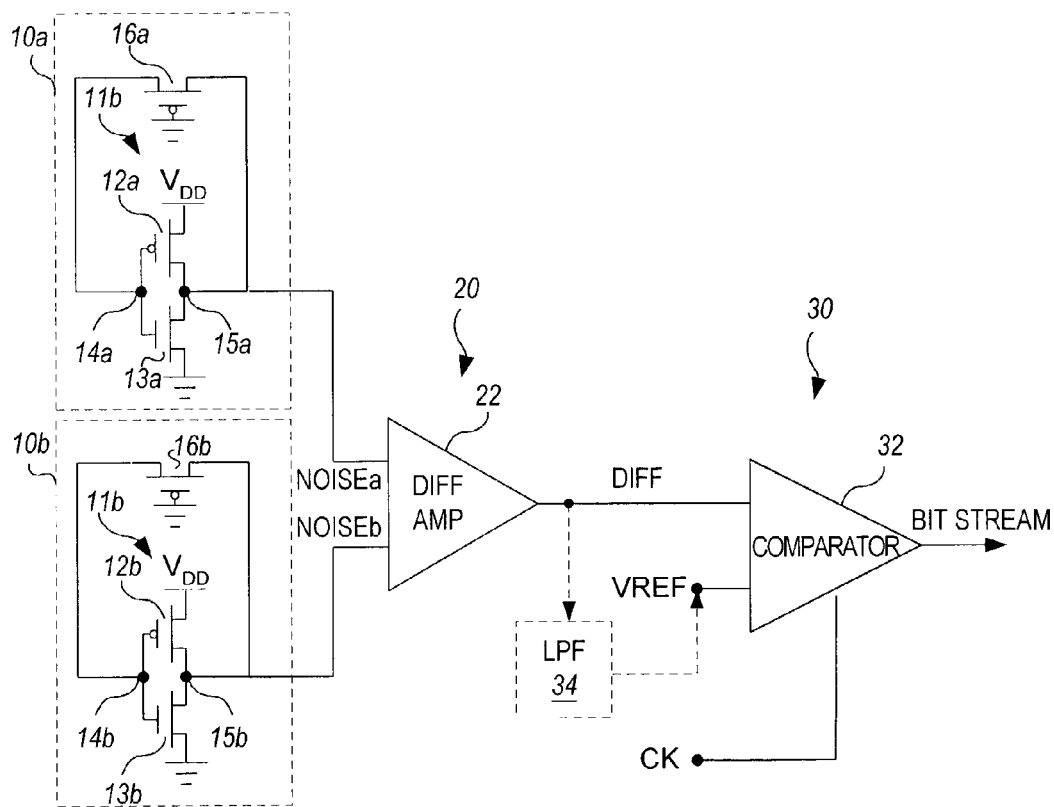
FIG. 2 is a schematic block diagram of one embodiment of a random bit generator implemented in accordance with the principles of the invention.

FIG. 2 is a schematic block diagram of one embodiment of the invention. It will be appreciated by those skilled in the art that variations in manufacturing process may cause the DC bias point of the noise generator circuit 10a to drift from its optimal level—that is, the DC bias point may vary to be somewhere between VDD/2+/−Δ. As known in the art, introducing bias above or below the optimal operating point of the inverter will ultimately interfere with the randomness of the random bit stream data. Accordingly, in the preferred embodiment of the invention, the bias is eliminated by sampling the difference of two identical noise generator circuits. Thus, in the embodiment of FIG. 2, the random bit generator includes at least a pair of identical noise generator circuits 10a, 10b. Each noise generator 10a comprises an inverter 11a with a conducting feedback transistor 16a connected between the inverter output 15a and the inverter input 14a.

Each inverter 11a, 11b comprises a PFET 12a, 12b and an NFET 13a, 13b. Each PFET 12a, 12b is source-coupled to a high voltage source VDD, gate-coupled to the inverter input 14a, 14b, and drain coupled to the inverter output 15a, 15b. Likewise, each NFET 13a, 13b is source-coupled to a low voltage source (ground), gate-coupled to the inverter input 14a, 14b, and drain coupled to the inverter output 15a, 15b. Since the identical noise generator circuits 10a, 10b are manufactured in the same process, they will have identical DC bias points (VDD/2+/−Δ); however, since the thermal noise generated on each feedback FETs 16a, 16b is independent, the feedback FET 16a, 16b will generate different AC (noise) components on the output signal NOISEa, NOISEb.

In this embodiment, the amplifier 20 comprises a differential amplifier 22 which measures and amplifies the difference of the AC noise components of the output signal NOISEa, NOISEb. Thus, the output DIFF of the differential amplifier 22 represents the amplified difference of the noise components of noise generator output signals NOISEa, NOISEb.

The sampling circuit 30 receives the amplified signal DIFF, a DC threshold voltage VREF, and a clock signal CK. On the rising edge of the clock signal CK, the sampling circuit 30 compares the amplifier output signal DIFF to the DC threshold VREF, and outputs either a logical 0 or a logical 1 depending on whether the amplifier output signal DIFF is greater than or less than the DC threshold VREF. The comparison is performed by a comparator 32 on every rising edge of the clock signal CK and the output of the sampling circuit 30 is held it until next rising edge.

As known in the art, CMOS processes are subject to manufacturing process variation. Manufacturing process variation results in size variation between PFETs and NFETs, which results in variance in performance characteristics of the devices. Performance variation between the PFETs and NFETs in a CMOS circuit can be problematic in the realm of random bit generation because even a small variance away from the optimal value of a signal can bias the circuit such that there is a higher chance of generating one bit value than the other (e.g., more logical 1s than logical 0s, or vice versa).

Figure 3:
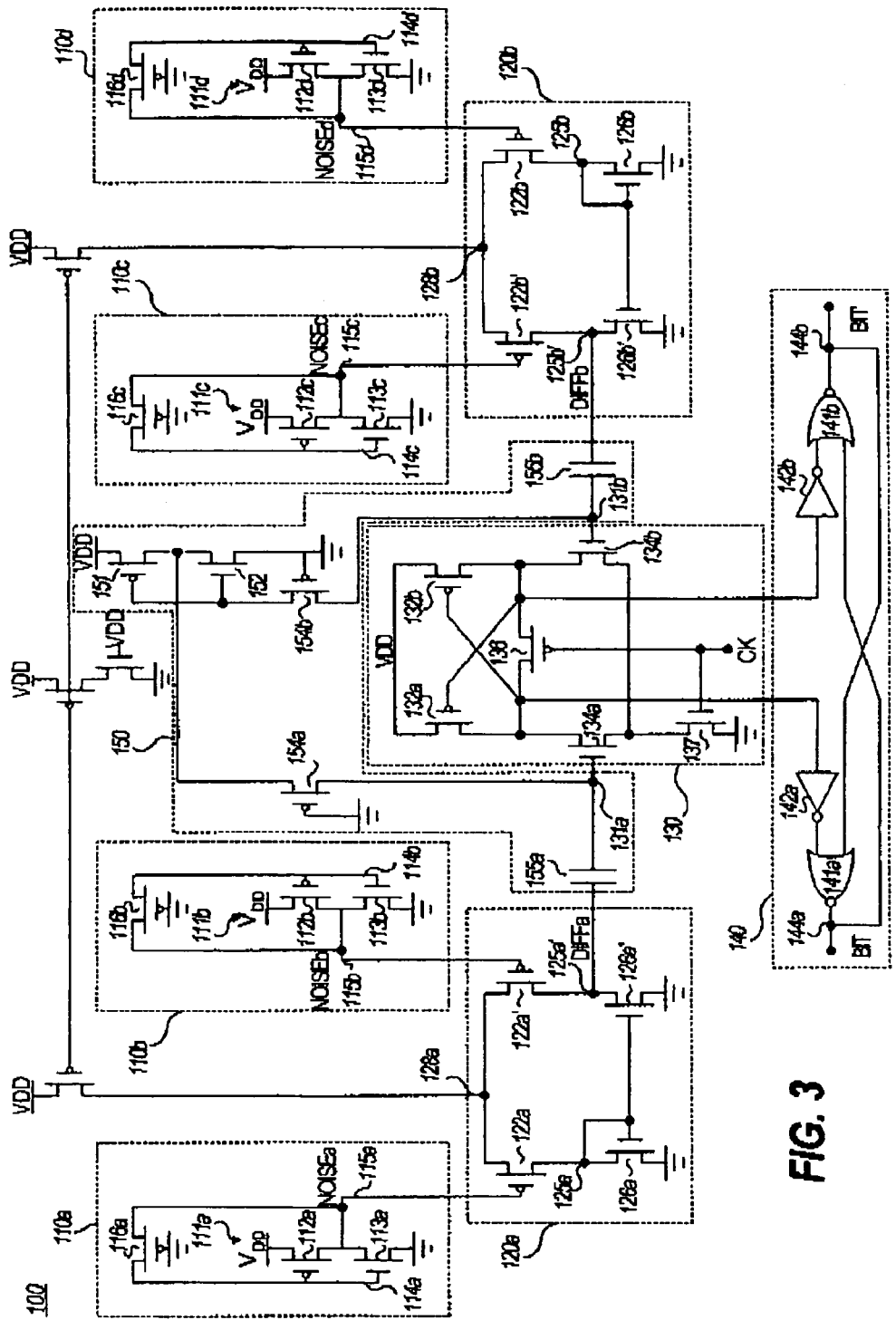
FIG. 3 is a schematic diagram of a preferred embodiment of a random bit generator implemented in accordance with the principles of the invention.

FIG. 3 illustrates a preferred embodiment of a random bit generator 100 constructed in accordance with the principles of the invention and which minimizes signal bias as much as possible. As illustrated, the random bit generator 100 includes two pairs of noise generator circuits 110a, 110b, 110c, and 110d. Each noise generator circuit 110a, 110b, 110c, and 110d comprises a complementary CMOS inverter 111a, 111b, 111c, and 111d and a feedback FET 116a, 116b, 116c, 116d providing conductance between the output 115a, 115b, 115c, 115d, and input 114a, 114b, 114c, 114d of the inverter 111a, 111b, 111c, and 111d. In particular, each inverter 111a, 111b, 111c, and 111d is formed with a PFET 112a, 112b, 112c, and 112d source-coupled to a high voltage source, drain-coupled to an inverter output node 115a, 115b, 115c, and 115d, and gate-coupled to an inverter input node 114a, 114b, 114c, 114d, and an NFET 113a, 113b, 113c, 113d source-coupled to a low voltage source, drain-coupled to the inverter output node 115a, 115b, 115c, 115d, and gate coupled to the inverter input node 114a, 114b, 114c, 114d. In the illustrative embodiment, the feedback FET 116a, 116b, 116c, 116d comprises a PFET source-connected to the inverter output node 1115a, 115b, 115c, 115d, drain-connected to the inverter input node 114a, 114b, 114c, 114d, and gate-connected to the low voltage source.

In the ideal case, the output 115a, 115b, 115c, 115d and input 114a, 114b, 114c, 114d of the inverter 111a, 111b, 111c, and 111d are both driven to a DC voltage level of VDD/2. However, thermal noise generated in the feedback FET 116a, 116b, 116c, 116d causes current fluctuation between the output 115a, 115b, 115c, 115d and input 114a, 114b, 114c, 114d. The noise signal NOISEa, NOISEb, NOISEc, NOISEd may be measured on the output 115a, 115b, 115c, 115d of the inverter 111a, 111b, 111c, and 111d.

Figure 4:
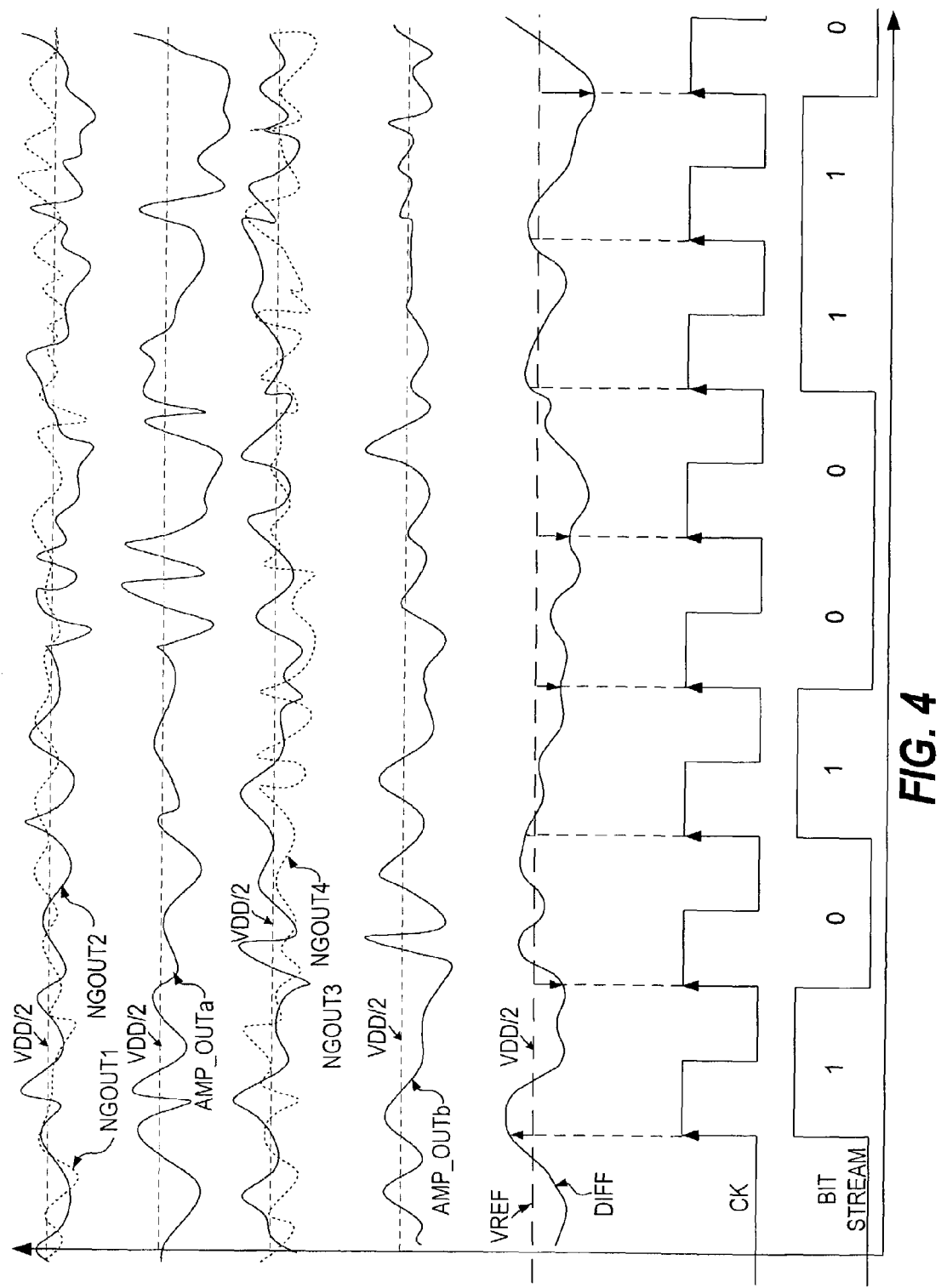
FIG. 4 is a timing diagram illustrating several example signals of the random bit generator of FIG. 3.

The output signal NOISEa, NOISEb, NOISEc, NOISEd on output 115a, 115b, 115c, 115d comprises a DC component having a DC bias level of approximately VDD/2, as just described, and an AC component representing the thermal noise of the feedback FET 116a, 116b, 116c, 116d. FIG. 4 illustrates example noise signals NOISEa, NOISEb, NOISEc, NOISEd.

It will be appreciated by those skilled in the art that variations in manufacturing process may cause the DC bias point of the noise generator circuits 110a, 110b, 110c, 110d to vary. In other words, the DC bias point may be biased to VDD/2+/−Δ. As known in the art, introducing bias above or below the optimal operating point of the inverter 111a, 111b, 111c, 111d will interfere with the randomness of the data. Accordingly, in the preferred embodiment of the invention, the randomness is achieved by sampling the difference of two identical noise generator circuits. Thus, the random bit generator of the invention includes at least a pair of identical noise generator circuits 110a, 110b. Since the identical noise generator circuits 110a, 110b are manufactured in the same process, they will have identical DC bias points (VDD/2+/−Δ); however, since the thermal noise generated on each feedback FET 116a, 116b is independent, the feedback FETs 116a, 116b will generate different AC (noise) components on the respective output signal NOISEa, NOISEb.

Typical thermal noise will generate an AC noise signal on the order of 1 to 2 millivolts. The noise signal is therefore very small with respect to the level of the power supply of VDD (typically 3–5 volts). Because thermal noise is efficiently chaotic, the variation of the noise signal NOISEa, NOISEb, NOISEc, NOISEd on the output 115a, 115b, 115c, 115d of the inverter 111a, 111b, 111c, and 111d is, for all practical purposes, random.

As just described the output signal NOISEa, NOISEb, NOISEc, NOISEd comprises a large DC voltage component (approximately VDD/2) with a very small AC oscillation around the DC bias level. Because the AC noise component of the output signal NOISEa, NOISEb, NOISEc, NOISEd is so small, it must be measured and amplified to provide a useful measure of randomness. Accordingly, the preferred embodiment of the invention includes a pair of differential amplifiers 120a, 120b which each receive the output signal NOISEa, NOISEb, NOISEc, NOISEd from the noise generator circuit 110a, 110b, 110c, and 110d at respective differential amplifier input nodes 121a, 121a', 121b, 121b'.

Each differential amplifier 120a, 120b is formed using a pair of PFETs 122a, 122a', and 122b, 122b' source-coupled to a biased node 128a, 128b and drain-coupled to differential output nodes 125a, 125a', and 125b, 125b', and a pair of complementary NFETs 126a, 126a' and 126b, 126b' source-coupled to a low voltage source (e.g., ground) and drain-coupled to the differential output nodes 125a, 125a', and 125b, 125b'. The gates of PFETs 122a, 122a', 122b, 122b' are driven by the output signal NOISEa, NOISEb, NOISEc, NOISEd from respective noise generator circuits 110a, 110b, 110c, 110d. Since the output signal NOISEa, NOISEb, NOISEc, NOISEd is DC-biased at approximately VDD/2, the PFETs 122a, 122a', and 122b, 122b' are conducting but not saturated. Accordingly, the AC noise component of the output signal NOISEa, NOISEb, NOISEc, NOISEd causes more or less current to flow to the respective differential amplifier output nodes 125a, 125a', and 125b, 125b' depending on whether the AC noise component of the output signal NOISEa, NOISEb, NOISEc, NOISEd is below or above the DC bias point (i.e., VDD/2±Δ). At the same time, one leg of the differential amplifier 120a, 120b has its differential amplifier output node 125a, 125b' connected to drive the gates of NFETs 126a, 126a', 126b, 126b'. Accordingly, the AC noise component of the output signal NOISEa, NOISEb, NOISEc, NOISEd causes more or less current to flow through NFETs 126a, 126a', 126b, 126b' to the respective differential amplifier output nodes 125a, 125a', 125b, 125b' depending on whether the AC noise component of the output signal NOISEa, NOISEb, NOISEc, NOISEd is above or below the DC bias point (i.e., VDD/2+/−Δ).

Thus, the differential amplifier 120a, 120b generates on output node 125a', 125b a signal DIFFa, DIFFb which represents the amplified difference of the noise components of noise generator output signals NOISEa, NOISEb, and NOISEc, NOISEd. In the preferred embodiment, the gain of each differential amplifier 120a, 120b is approximately 20. This provides a variation on the order of a couple of hundred millivolts on the differential amplifier output signal DIFFa, DIFFb, which is large enough to sample.

The random bit generator 100 also includes a sampling circuit 130. The sampling circuit 130 receives a clock signal CK. On the rising edge of the clock signal CK, the sampling circuit 130 compares the differential amplifier output signal DIFFa, DIFFb to a DC threshold (VDD/2+/−Δ) and generates a signal indicating whether the differential amplifier output signal DIFFa, DIFFb is greater than or less than the threshold. The comparison is performed on every rising edge of the clock signal CK and the result is held it until next rising edge.

In order to ensure pure randomness in the process, it is important to ensure that the threshold value is unbiased such that the differential amplifier output signal DIFFa, DIFFb will on average spend half the time greater and half the time less than the DC threshold. Stated another way, the circuit must be constructed such that there is an equal chance that on rising edge of clock signal CK the differential amplifier output signal DIFFa, DIFFb will be greater and less than the chosen DC threshold value.

In one embodiment, for example in FIG. 2, the DC threshold value VREF for the comparator 32 is generated by passing the differential amplifier output signal DIFF through a low pass filter to extract the DC component of the signal. In this embodiment, only the first half of the circuit need be implemented—that is, the random bit generator is implemented with dual noise generator circuits 10a, 10b, differential amplifier 22, and a sampler 30 which filters out the DC component of the differential amplifier output signal DIFF and uses the extracted DC component as the threshold value VREF input to the sampling circuit 30.

Alternatively, as shown in the embodiment of FIG. 3, the random bit generator 100 mirrors the noise generator circuits 110a, 110b and differential amplifier 120a with noise generator circuits 110c, 110d and differential amplifier 120b to generate a second differential amplifier output signal DIFFb. In theory, if implemented identically, the second differential amplifier output signal DIFFb will have same DC component value as the first differential amplifier output signal DIFFa. However, since the noise difference component of the second differential amplifier output signal DIFFb is independent of the noise difference component of the first differential amplifier output signal DIFFa, the amplitude of the difference between the two noise components of the differential amplifier output signals DIFFa and DIFFb is potentially twice as large as compared to measuring a single differential amplifier output signal DIFFa against a DC reference threshold (as in the embodiment of FIG. 2). This allows simpler measurement using smaller amplifier gains.

In the preferred embodiment, the sampling circuit 130 is a clocked comparator circuit formed using a pair of PFETs 132a, 132b each source-coupled to the high voltage source VDD and drain-coupled to respective comparator output nodes 133a, 133b, and a pair of NFETs 134a, 134b each source-coupled to the low voltage source (ground) and drain-coupled to the respective comparator output nodes 133a, 133b. The gate of each PFET 132a, 132b is cross-coupled to the opposite comparator output node 133b, 133a, and the gate of each NFET 134a, 134b is connected to receive respective differential amplifier output signals DIFFa, DIFFb. A PFET 136 is coupled between the comparator output nodes 133a, 133b to provide either conductive coupling or isolation between the comparator output nodes 133a, 133b. The gate of the PFET 136 is driven by a clock signal CK.

In operation, when the clock signal CK is low, PFET 136 conducts in the non-saturated region such that the comparator output nodes 133a, 133b have identical voltage levels (approximately VDD). When the clock signal goes high, PFET 136 is placed in the cutoff region, thereby isolating the comparator output nodes 133a, 133b from one another. Simultaneously, NFET 137 turns on to pull the source of NFETs 134a, 134b to ground. When this happens, charge beings to be pulled off of both comparator output nodes 133a and 133b. If the differential amplifier output signal DIFFa at the gate of NFET 134a has a higher voltage than the differential amplifier output signal DIFFb at the gate of NFET 134b on the rising edge of the clock signal CK, comparator output node 133a will be pulled down faster than comparator output node 133b, which eventually will turn on PFET 132b first, which pulls comparator output node 133a high and prevents comparator output node 133b from being pulled low. If instead the differential amplifier output signal DIFFb at the gate of NFET 134b has a higher voltage than the differential amplifier output signal DIFFa at the gate of NFET 134a on the rising edge of the clock signal CK, comparator output node 133b will be pulled down faster than comparator output node 133a, which eventually will turn on PFET 132a first, which pulls comparator output node 133b high and prevents comparator output node 133a from being pulled low.

Accordingly, the sampling circuit 130 samples the difference between DIFFa and DIFFb on the rising edge of the clock signal CK and turns the polarity of the difference into a logical value. The logical value is then latched and buffered to the outputs by a latching and buffering circuit 140. Latching and buffering circuit 140 comprises a pair of NOR gates 141a, 141b, electrically connected to the output of a respective one of a pair of inverters 142a, 142b. The output of each NOR gate 141a, 141b, is cross-coupled to one of the inputs of the other NOR gate 141b, 141a. The comparator output node 133a feeds inverter 142a, and the comparator output node 133b feeds inverter 142b.

Even in the face of using the differential amplifier circuits 120a and 120b, local process variations may cause a bias on the DC component of the differential amplifier output signal so as to not generate a statistically random bit stream. In other words, if the DC component of the differential amplifier output signals DIFFa and DIFFb are slightly skewed from one another due to local manufacturing process variations in the CMOS components, the random bit stream might not be evenly weighted such that there exists an equal chance of the amplified noise difference falling above or below the threshold.

Accordingly, in the preferred embodiment, the random bit generator 100 includes a DC bias point optimization circuit 150. DC bias point optimization circuit 150 includes a PFET 151 and an NFET 152 which generate a reference bias voltage V_REF on reference bias node 153 (to VDD/2 approximately). A pair of transfer PFETs 154a, 154b operate as high impedance resistors that transfer the reference voltage VREF to the comparator input nodes 131 a, 131b. Capacitors 155a and 155b are preferably metal coupling capacitors formed from interconnect metal. The FETs 151, 152, 154a, 154b establish an identical non-skewed DC signal component (at VREF) at the input of comparator input nodes 131a, 131b. The coupling capacitors 155a, 155b operate as a high pass filter to pass the noise (AC) component and filter the DC component of the differential amplifier output signals DIFFa, DIFFb. Accordingly, the inputs to 131a, 131b the sampling circuit 130 are driven by the non-skewed DC signal component (at VREF) combined with the noise (AC) components of the differential amplifier output signals DIFFa, DIFFb. This ensures that no skew exists between the DC components of the differential amplifier output signals DIFFa, DIFFb. Accordingly, the AC noise components of the differential amplifier output signals DIFFa, DIFFb reach the inputs 131a, 131b of the sampling circuit 130 virtually undiminished, while the DC bias is determined by one source VREF.

It will be appreciated by those skilled in the art that symmetry plays an important part in removing signal biases within the circuit which may interfere with the generation of a truly random bit stream from a CMOS process. In the preferred embodiment, all components are therefore laid out symmetrically and call for differential techniques.

Thermal noise has a frequency spectrum that is not perfectly ideal for generating random numbers. The low frequency components are too large relative to the high frequency components. In order to ensure the prevention of long streams of 1s and 0s (which would result from excessive low frequency components), the circuit should roll off the frequency response of the noise source (i.e., run it through a high pass filter) such that the frequency components of the noise source are significantly higher than the sampling clock (or strobe). In the preferred embodiment, this is accomplished by carefully sizing the feedback transistor 116a, 116b, 116c, 116d relative to the size of the inverter (111a, 111b, 111c, 111d) that it is biasing. Most of the noise energy is between 100 MHz and 1 GHz. The low frequency noise (often called "shot noise") is filtered out by sizing the inverter FETs with relatively low-impedance transistors, which are preferably sized to filter out noise below approximately 100 MHz.

The determining the sizing of the FETs in the noise generator circuits 110a, 110b, 110c, 110d, the feedback transistor 116a, 116b, 116c, 116d must be sized long enough so that there is a slight delay before the inverter input 114a, 114b, 114c, 114d responds to noise on the inverter output 115a, 115b, 115c, 115d, thereby filtering out low frequency components.

Table 1 lists the FET component sizes for a 0.13 micron process implementation of the preferred embodiment of FIG. 3.

TABLE 1

| Component | Length (in microns) | Width (in microns) | Capacitance (in picoFarads) |
|---|---|---|---|
| 112a | 1 | .24 | |
| 112b | 1 | .24 | |
| 112c | 1 | .24 | |
| 112d | 1 | .24 | |
| 113a | 1 | .24 | |
| 113b | 1 | .24 | |
| 113c | 1 | .24 | |
| 113d | 1 | .24 | |
| 116a | .22 | .24 | |
| 116b | .22 | .24 | |
| 116c | .22 | .24 | |
| 116d | .22 | .24 | |
| 122a | 1 | 16 | |
| 122a' | 1 | 16 | |
| 122b | 1 | 16 | |
| 122b' | 1 | 16 | |
| 126a | 1 | 8 | |
| 126a' | 1 | 8 | |
| 126b | 1 | 8 | |
| 126b' | 1 | 8 | |
| 124a | 16 | .24 | |
| 124b | 16 | .24 | |
| 132a | 1 | 2 | |
| 132b | 1 | 2 | |
| 134a | 1 | 2 | |
| 134b | 1 | 2 | |
| 136 | 1 | 4 | |
| 151 | .22 | .24 | |
| 152 | .22 | .24 | |
| 154a | .22 | .24 | |
| 154b | .22 | .24 | |
| 155a | | | <20 |
| 156b | | | <20 |

FIG. 4 shows a timing diagram illustrating various signals in the random bit generator of FIG. 3 which ultimately generate a random bit stream.

Figure 5:
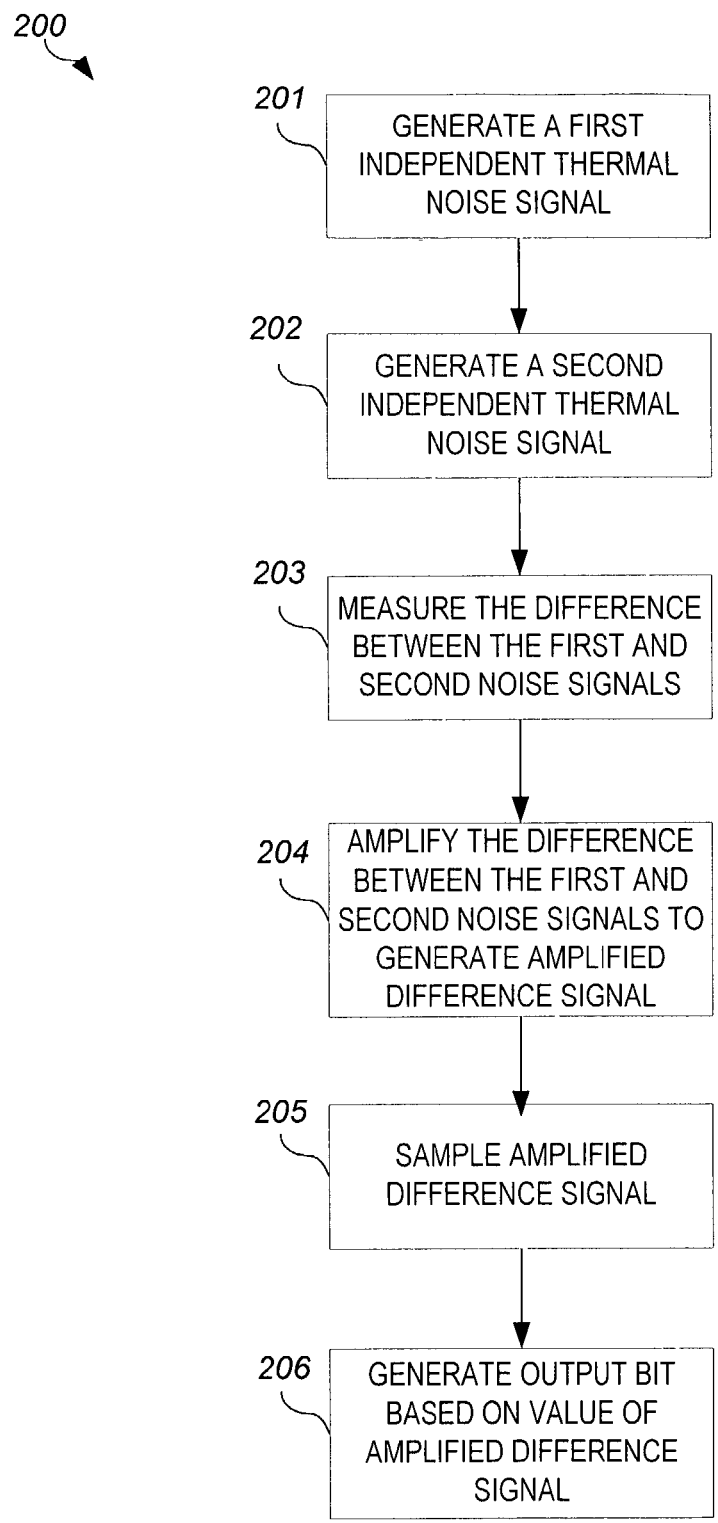
FIG. 5 is an operational flow diagram illustrating the method of the invention.

FIG. 5 is an operational flowchart illustrating the method 200 of the invention. As illustrated, the method of the invention includes: generating 201 a first noise signal representing thermal noise on a first CMOS device, generating 202 a second noise signal representing thermal noise on a second CMOS device, measuring 203 a difference between the first and second noise signals, amplifying 204 the measured difference to generate an amplified difference signal, sampling 205 the amplified difference signal; and generating 206 an output bit having a bit value based on the value of the amplified difference signal.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A random bit generator, comprising:
   a first noise generator circuit which generates a first noise signal;
   a second noise generator circuit which generates a second noise signal;
   a first difference circuit which receives said first noise signal and said second noise signal, determines a first difference between said first noise signal and said second noise signal, and generates a first noise difference signal; and
   a sampling circuit which samples said first noise difference signal and generates an output bit having a bit value based on said first noise difference signal, said sampling circuit comprising a comparator which compares said first noise difference signal to a threshold to generate a comparator output signal having a first bit value when said first noise difference signal is greater than said threshold and a second bit value when said first noise difference signal is less than said threshold, and a low pass filter which filters said first noise difference signal to generate said threshold.

2. A random bit generator in accordance with claim 1, wherein said first noise generator circuit and said second noise generator circuit each comprise at least one NFET and at least one PFET and wherein said at least one NFET and said at least one PFET of each of said first noise generator circuit and said second noise generator circuit vary similarly over process variation.

3. A random bit generator in accordance with claim 1, wherein said first difference circuit comprises:
   a first differential amplifier which receives said first noise signal and said second noise signal, amplifies said first difference between said first noise signal and said second noise signal, and generates said first noise difference signal.

4. A random bit generator in accordance with claim 1, wherein each said first noise generator circuit and said second noise generator circuit comprise:
   a complementary CMOS inverter having an inverter input and an inverter output; and
   a feedback FET generating thermal noise and conductively coupled between said inverter output and said inverter input.

5. A random bit generator in accordance with claim 4, wherein each said complementary CMOS inverter comprises low-impedance FETs which operate to filter out low frequency components of said thermal noise.

6. A random bit generator, comprising:
   a first noise generator circuit which generates a first noise signal;
   a second noise generator circuit which generates a second noise signal;
   a first difference circuit which receives said first noise signal and said second noise signal, determines a first difference between said first noise signal and said second noise signal, and generates a first noise difference signal;
   a third noise generator circuit which generates a third noise signal;
   a fourth noise generator circuit which generates a fourth noise signal;
   a second difference circuit which receives said third noise signal and said fourth noise signal, determines a second difference between said third noise signal and said fourth noise signal, and generates a second noise difference signal; and
   a sampling circuit which compares said first noise difference signal and said second noise difference signal to a threshold and generates an output signal representing whether said first noise difference signal and said second noise difference signal are greater than or less then said threshold.

7. A random bit generator in accordance with claim 6, wherein:
   said first difference circuit comprises a first differential amplifier which receives said first noise signal and said second noise signal, amplifies said first difference between said first noise signal and said second noise signal, and generates said first noise difference signal; and
   said second difference circuit comprises a second differential amplifier which receives said third noise signal and said fourth noise signal, amplifies said second difference between said third noise signal and said fourth noise signal, and generates said second noise difference signal.

8. A random bit generator in accordance with claim 6, wherein said sampling circuit comprises:
   a third difference circuit which measures a third difference between said first noise difference signal and said second noise difference signal and translates said third difference into one or the other of a first output state when said third difference is greater than said threshold and a second output state when said third difference is less than said threshold.

9. A random bit generator in accordance with claim 8, wherein said third difference circuit comprises:
   a comparator which receives said third difference, compares said third difference to a threshold, and generates said comparator output signal.

10. A random bit generator in accordance with claim 9, further comprising:
    a threshold optimization circuit which generates said threshold, filters outs DC component from said first noise difference signal and said second noise difference signal, combines a noise component of said first noise difference signal with said threshold for input to said sampling circuit, and combines a noise component of said second noise difference signal with said threshold for input to said sampling circuit.

11. A method for generating a random bit stream, comprising:
    generating a first noise signal representing thermal noise on a first CMOS device;
    generating a second noise signal representing thermal noise on a second CMOS device;
    measuring a difference between said first noise signal and said second noise signal;
    amplifying said difference to generate an amplified difference signal;
    comparing said amplified difference signal to a reference threshold;
    assigning said output bit value to a first state when said amplified difference signal is greater than said reference threshold; and
    assigning said output bit value to a second state when said amplified difference signal is less than said reference threshold;
    extracting a DC component from said amplified difference signal to generate said reference threshold; and
    generating an output bit having a bit value based on said amplified difference signal.

12. A method for generating a random bit stream, comprising:
    generating a first noise signal representing thermal noise on a first CMOS device;
    generating a second noise signal representing thermal noise on a second CMOS device;
    measuring a difference between said first noise signal and said second noise signal;
    amplifying said difference to generate a first amplified difference signal;
    generating a third noise signal representing thermal noise on a third CMOS device;
    generating a fourth noise signal representing thermal noise on a fourth CMOS device;

measuring a second difference between said third noise signal and said fourth noise signal;

amplifying said second difference to generate a second amplified difference signal;

comparing said first noise difference signal and said second noise difference signal to a reference threshold; and generating an output signal representing whether said first noise difference signal and said second noise difference signal are greater than or less than said reference threshold.

13. A method in accordance with claim 12, further comprising the steps of:

measuring a third difference between said first noise difference signal and said second noise difference signal; and translating said third difference into one or the other of a first output state when said third difference is greater than said threshold and a second output state when said third difference is less than said reference threshold.

14. A method in accordance with claim 12, further comprising the steps of:

generating said reference threshold;

filtering out a DC component of said first amplified difference signal and said second amplified difference signal;

combining said reference threshold with a noise component of said first amplified difference signal and said second amplified difference signal to generate an optimized first amplified difference signal and an optimized second amplified difference signal;

measuring a third difference between said optimized first amplified difference signal and said optimized second amplified difference signal; and translating said third difference into one or the other of a first output state when said third difference is greater than said threshold and a second output state when said third difference is less than said reference threshold.

* * * * *